United States Patent [19]

Lehmann et al.

[11] Patent Number: 4,680,244

[45] Date of Patent: Jul. 14, 1987

[54] LIGHT-SENSITIVE RECORDING MATERIAL FOR THE PRODUCTION OF A PRINTING FORM OR PRINTED CIRCUIT WITH PHOTOCONDUCTIVE LAYER AND LIGHT-SENSITIVE OVERLAYER

[75] Inventors: Peter Lehmann, Kelkheim, Fed. Rep. of Germany; Manfred Michel, Suzano, Brazil

[73] Assignee: Hoechst Aktiengesellschaft, Frankfurt am Main, Fed. Rep. of Germany

[21] Appl. No.: 712,660

[22] Filed: Mar. 18, 1985

[30] Foreign Application Priority Data

Mar. 17, 1984 [DE] Fed. Rep. of Germany ...... 3409888

[51] Int. Cl.⁴ .................. G03C 5/14; G03C 1/495; G03C 1/54
[52] U.S. Cl. .................. 430/66; 430/49; 430/57; 430/67; 430/69; 430/156; 430/165; 430/166; 430/302; 430/312; 430/271
[58] Field of Search .............. 430/66, 67, 166, 165, 430/49, 156, 57, 69, 302, 312, 271

[56] References Cited

U.S. PATENT DOCUMENTS

| | | | |
|---|---|---|---|
| 2,367,660 | 1/1945 | Agre | 204/158 |
| 2,367,661 | 1/1945 | Agre | 204/158 |
| 2,367,670 | 1/1945 | Christ | 154/2 |
| 2,448,828 | 9/1948 | Renfrew | 204/162 |
| 2,722,512 | 11/1955 | Crandall | 204/158 |
| 2,848,328 | 8/1958 | Hepher | 96/91 |
| 2,939,787 | 6/1960 | Giaimo, Jr. | 96/1 |
| 2,951,758 | 9/1960 | Notley | 96/35 |
| 3,046,127 | 7/1962 | Barney et al. | 96/35 |
| 3,112,197 | 11/1963 | Neugebauer et al. | 96/1 |
| 3,189,447 | 6/1965 | Neugebauer et al. | 96/1 |
| 3,215,529 | 11/1965 | Lindquist et al. | 430/156 |
| 3,218,167 | 11/1965 | Burg et al. | 96/85 |
| 3,244,517 | 4/1966 | Lind | 96/1 |
| 3,257,203 | 6/1966 | Sus et al. | 96/1.5 |
| 3,287,123 | 11/1966 | Heogl | 96/1.5 |
| 3,313,626 | 4/1967 | Whitney | 430/156 |
| 3,549,367 | 12/1970 | Chang et al. | 96/35.1 |
| 3,732,106 | 5/1973 | Steppan et al. | 96/115 |
| 3,751,259 | 8/1973 | Bauer et al. | 96/115 |
| 3,884,693 | 5/1975 | Bauer et al. | 96/15 |
| 3,930,865 | 1/1976 | Faust et al. | 96/86 |
| 4,063,948 | 12/1977 | Lind | 96/1.6 |
| 4,108,657 | 8/1978 | Mey | 430/57 |
| 4,186,017 | 1/1980 | Palmer | 430/162 |
| 4,296,190 | 10/1981 | Hasegawa et al. | 430/57 |
| 4,387,151 | 6/1983 | Bosse et al. | 430/175 |
| 4,388,391 | 6/1983 | Schell | 430/49 |
| 4,421,844 | 12/1983 | Buhr et al. | 430/326 |
| 4,435,491 | 3/1984 | Kitamura et al. | 430/156 |
| 4,442,191 | 4/1984 | Nishikawa | 430/57 |
| 4,472,491 | 9/1984 | Wiedemann | 430/58 |
| 4,500,617 | 2/1985 | Nakagawa | 430/49 |
| 4,506,006 | 3/1985 | Ruckert et al. | 430/325 |
| 4,518,668 | 5/1985 | Nakagama | 430/49 |
| 4,521,503 | 6/1985 | Herbert | 430/49 |

FOREIGN PATENT DOCUMENTS

| | | |
|---|---|---|
| 0053362 | 6/1982 | European Pat. Off. . |
| 765909 | 1/1957 | United Kingdom . |
| 790131 | 2/1958 | United Kingdom . |
| 851218 | 10/1960 | United Kingdom . |
| 944126 | 12/1963 | United Kingdom . |
| 996315 | 6/1965 | United Kingdom . |
| 1230447 | 5/1971 | United Kingdom . |
| 1274296 | 5/1972 | United Kingdom . |
| 1312925 | 4/1973 | United Kingdom . |
| 2014748 | 8/1979 | United Kingdom . |
| 2121201 | 12/1983 | United Kingdom . |

*Primary Examiner*—Charles L. Bowers, Jr.
*Attorney, Agent, or Firm*—Schwartz, Jeffery, Schwaab, Mack Blumenthal & Evans

[57] ABSTRACT

The disclosed light-sensitive recording material is composed of an electrically conductive support, suitable for the production of printing forms or printed circuits, and a photoconductive layer system containing a photoconductor, a binder, a sensitizing dye and conventional additives. The photoconductive system comprises (A) a single photoconductive layer, or multiple layers, applied to the support and (B) a light-sensitive covering layer which contains at least one photochemically reactive compound. The use of the recording material in a process for the production of printing forms and printed circuits is also disclosed.

8 Claims, 14 Drawing Figures

LIGHT-SENSITIVE RECORDING MATERIAL FOR THE PRODUCTION OF A PRINTING FORM OR PRINTED CIRCUIT WITH PHOTOCONDUCTIVE LAYER AND LIGHT-SENSITIVE OVERLAYER

BACKGROUND OF THE INVENTION

The present invention relates to a light-sensitive recording material composed of an electrically conductive support, suitable for the production of a printing form or printed circuit, and a photo-conductive layer system containing a photoconductor, a binder, a sensitizing dye and conventional additives. The present invention further relates to the use of the aforesaid recording material in a process for the production of a printing form or printed circuit.

Processes have been disclosed which exploit the high light sensitivity of electrophotographic systems for the production of images. A particular advantage of such processes is that the image can be produced by laser exposure or projection exposure. A film original is not necessary.

The production of planographic printing plates by electrophotographic means has been disclosed by German Pat. No. 1,117,391, corresponding to British Pat. No. 944,126. The disclosed printing plates are provided with a coating which, in addition to a suitable binder and an appropriate sensitizing dye, contains an organic photoconductor. A latent charge image, which is rendered visible by means of a dry or liquid developer, is produced on this layer by electrostatic charging and imagewise exposure. The toner image obtained is fixed, for example by heating the plate, so that, in a final decoating step, the toner image areas are protected from attack by the decoating solution.

However, such a process still has disadvantages. For example, the fixed toner must either be washed off the printing plate surface by means of a solvent, or an increased number of waste sheets at the start of printing must be accepted, when the toner only "runs off" in the printing machine. The achievable resolution is also limited, since baking off the toner leads to undesirable shifts in tonal value. Moreover, the temperature in the baking phase must be kept within the optimum range, with considerable expense entailed in the controls. Finally, relatively long runs are not obtained, since the printing image areas do not withstand mechanical stress for a prolonged period.

Attempts have already been made to combine the advantages of the electrophotographic process described with those of conventional positive- or negative-working systems. German Pat. No. 1,447,008, corresponding to British Pat. No. 996,315, has disclosed the production of a planographic printing plate which was coated with a mixture of organic photoconductors and the constituents of conventional positive-working layers based on o-quinonediazide. The toner image produced electrophotographically on this layer was used as a photomask in a further exposure step with actinic light. The differentiation of solubility between the image areas and non-image areas was induced via the photochemical reaction of the exposed o-quinonediazide. The disadvantage in this process, however, is that the conductivity of the above-mentioned coating in the dark is high, and that the solubility differences between the image areas and non-image areas are limited because of the relatively high photoconductor content.

A negative-working photoconductor layer has been disclosed by German Pat. No. 1,811,209, corresponding to British Pat. No. 1,274,296. In this case, a recording material is used which, in the photoconductive layer, contains a photopolymerizable photoconductor, selected from the vinyloxazoles and vinylcarbazoles. The disadvantage in this approach is that, even with the high photoconductor content of the layer, the hardening of the areas not covered by toner still does not meet more stringent requirements, in spite of a relatively high light intensity.

In order to avoid the disadvantages of these processes, attempts have also been made to apply a photoconductor layer to the light-sensitive layer. Such double layers are described in German Pat. No. 1,071,478, corresponding to U.S. Pat. No. 2,939,787, in European Patent Application No. 0,053,362 and in German Offenlegungsschrift No. 3,310,804, corresponding to British Pat. No. 2,121,201. In all cases, a photoconductor layer is applied as a covering layer to a conventionally positive-working or negative-working light-sensitive coating. Such a procedure is similar to an electrophotographic process, because the toner image can then be produced on the surface of the photoconductor layer.

But this combination of layers has a number of disadvantages. On the one hand, there is an increased risk of halations, since the photoconductor mask formed by the toner image and the light-sensitive base layer are separated from one another by the photoconductor layer. The photoconductor layer must therefore be as thin as possible. On the other hand, the layer may contain only those photoconductors and sensitizer dyes which are transparent to radiation of those wavelengths which are suitable for a photoreaction in the light-sensitive layer. Moreover, when the photoconductor layer and a negative-working layer are combined, the photoconductor layer is also removed from the image areas on decoating. It is therefore no longer available for the further processing steps. This is also true for the combination of photoconductor layer and a positive-working layer, if the applied toner image is not fixed. If the toner image is fixed, however, there results an undesired toner run-off at the start of printing, as mentioned above. A final disadvantage is that, in cases where the interface between the photoconductor layer and the light-sensitive layer is not completely uniform, a layer of varying thickness is obtained after decoating, and this can lead to premature wear of the printing form produced thereby, or to a non-uniform reproduction of halftone originals.

SUMMARY OF THE INVENTION

It is therefore an object of the present invention to combine the advantages of electrophotography and conventional imaging processes utilizing light-sensitive coatings, while avoiding the above-described disadvantages of the known imaging methods.

It is also an object of the present invention to provide a recording material which utilizes both a photoconductor and a photochemically reactive composition, and which is capable of meeting stringent technical demands with respect to length of printing run, light sensitivity, resolution, and ease-of-handling.

It is still another object of the present invention to provide an image-recording process which does not require contact between a photosensitive surface and an image original, and which can be employed in the manufacture of printing forms and printed circuits.

In accomplishing the foregoing objects, there has been provided, in accordance with one aspect of the present invention, a light-sensitive recording material comprised of an electrically conductive support, at least one photoconductive layer applied to said support, and a light-sensitive covering layer applied to said photoconductive layer, said covering layer comprising at least one photochemically reactive composition. In preferred embodiments of the present invention, the aforesaid photochemically reactive composition comprises at least one compound having a solubility in an alkaline aqueous and/or alcoholic solvent system which is either increased or reduced by actinic irradiation.

In accordance with another aspect of the present invention, there has been provided a process for the production of printing forms and printed circuits, consisting essentially of the steps of (i) electrostatically charging a recording material comprised of an electrically conductive support, at least one photoconductive layer applied to said support, and a light-sensitive covering layer applied to said photoconductive layer, said covering layer comprising at least one photochemically reactive composition; then (ii) imagewise exposing said recording material to create a latent image comprised of image areas and non-image areas on said covering layer;

(iii) developing said latent image with an electrophotographic developer; thereafter (iv) subjecting said covering layer to actinic irradiation, whereby said image areas and said non-image areas, respectively, have differing solubility in an alkaline aqueous and/or an alcoholic solvent system; and then (v) treating said recording material with said solvent system, such that portions of said covering layer and said photoconductor layer are decoated from said support.

In preferred embodiments of the abovedescribed process, imagewise exposure of the recording material is effected by a laser, directly, or by projecting an original image onto the recording material, in both cases, without an image original contacting the recording material.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Figure 1:
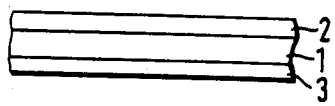
FIGS. 1 and 2 depict recording material of the present invention, with FIG. 2 showing the electrostatic charge configuration generated when the recording material is charged, in accordance with the present invention.

If a positive-working material is desired, the photochemically reactive compound present in the light-sensitive covering layer is preferably a compound, or a combination of compounds, the solubility of which in alkaline aqueous and/or alcoholic solvent systems is reduced by actinic radiation. If, on the other hand, a negative-working material is desired, the photochemically reactive compound present in the light-sensitive covering layer is a compound, or a combination of compounds, having a solubility in alkaline aqueous and/or alcoholic solvent systems which is increased by actinic radiation.

A recording material can be made available, in accordance with the present invention, which is distinguished by very long runs and high light sensitivity. The structure of the recording material of the present invention makes possible the imaging and solubility differentiation by irradiation with actinic light in separate working steps, without use of a vacuum frame, each step under optimum conditions. The reproduction of tonal values in halftone originals can also be controlled as a function of the duration of irradiation. In addition, uncontrolled halations are avoided, since the toner image is arranged on the light-sensitive covering layer.

Fixing of the toner image serving as a photomask is also not necessary. This has the advantage that falsification of the toner image by fixing is avoided. In addition, corrections are facilitated and easy removal of the toner particles is possible. On decoating of the material according to the present invention, the layer thickness in the areas not dissolved away is fully preserved in all cases. In the event that final hardening of the decoated material by application of heat is desired, such application acts in particular on the surface of the coating, which is exposed in any case to the most severe stress during the printing process.

According to the invention, the photoconductive layer 1 is composed of materials of the sort conventionally used for electrophotographic purposes, for example, those known from German Pat. No. 2,526,720, corresponding to U.S. Pat. No. 4,063,948. Photoconductive layer 1 is comprised of a photoconductor, a binder and a sensitizing dye, and these can be arranged in one layer or separately in a charge-generating layer and a charge-transporting layer, respectively. The photoconductive layer can be charged either positively or negatively.

Examples of suitable photoconductors are inorganic materials, such as selenium and zinc oxide; organic materials, such as anthracene, perylene, tetracene and derivatives of carbazole, acylhydrazones, oxadiazole, pyrazoline, imidazole, benzimidazole, benzoxazole and benzothiazole; organic pigments, such as indigo, phthalocyanine, metal phthalocyanines and perylene pigments; and organic polymeric compounds, such as poly-N-vinylcarbazole, and mixtures thereof. Highly sensitive compounds which are particularly suitable are metal-free phthalocyanines, metal phthalocyanines and derivatives of oxadiazole, oxazole, hydrazones and pyrazoline.

The use of photoconductive, in particular organic, substances in photoconductive layers, and their use for the production of printing forms, is known, for example, from the publications cited above in summarizing the state of the art. Those photoconductors which can be used in the present invention to particular advantage include aromatic, carbocyclic or heterocyclic compounds which are substituted by one or more dialkylamino groups.

Among the preferred photoconductor compounds mentioned above, the oxadiazole derivatives, particularly 2,5-bis-(4'-dialkylaminophenyl)-1,3,4-oxadiazole, are disclosed by German Pat. No. 1,058,836, corresponding to U.S. Pat. No. 3,189,447. Examples of other suitable photoconductors are triphenylamine derivatives, more highly fused aromatic compounds such as anthracene, benzofused heterocycles, and derivatives of pyrazoline and imidazole. Derivatives of triazole and oxazole, such as are known from German Pat. No. 1,060,260, corresponding to U.S. Pat. No. 3,112,197, and German Pat. No. 1,120,875, corresponding to U.S. Pat. No. 3,257,203, are also suitable photoconductors. In addition, vinylaromatic polymers, such as polyvinylanthracene, polyacenaphthylene, poly-N-vinylcarbazole and copolymers of these compounds are suitable, as are polycondensates of aromatic amines and aldehydes, such as are known from German Auslegeschrift No. 1,197,325, corresponding to U.S. Pat. No. 3,244,517. In addition to the aforesaid photoconductor compounds, which are predominantly of p-conducting character, nconducting compounds are also employed in the present invention. These so-called electron acceptors are known, for example, from German Pat. No. 1,127,218, corresponding to U.S. Pat. No. 3,287,123.

With respect to film-forming properties and adhesive strength, natural and synthetic resins are suitable as binders. In selecting these, solubility properties above all play an important role, in addition to the film-forming and electrical properties and those properties affecting strength of adhesion to the support. For practical purposes, those resin binders are particularly suitable which are soluble in aqueous or alcoholic solvent systems, with the addition, if appropriate, of acid or alkali. For physiological and safety reasons, aromatic or aliphatic, highly inflammable solvents are to be rejected. Advantageous resin binders are high-molecular substances which carry groups conferring solubility in alkali. Examples of such groups are acid anhydride, carboxyl, phenol, sulfonic acid, sulfonamide and sulfonimide groups. Preferably, resin binders with high acid numbers are used, since these are particularly readily soluble in alkaline-aqueous-alcoholic solvent systems. Copolymers with anhydride groups can be used particularly successfully since, due to the absence of free acid groups, the conductivity for the photoconductive layer in the dark is low, in spite of good solubility in alkali.

Copolymers of styrene and maleic anhydride, and also phenolic resins and reaction products of polymers containing hydroxyl groups with sulfonyl isocyanates according to European Pat. No. 0,048,876 (corresponding to U.S. Pat. No. 4,387,151), are very particularly suitable.

Dyes that are soluble or dispersible in organic solvents, and pigments, as have been employed hitherto as sensitizing agents can be used for this purpose in the present invention. Suitable sensitizers are known, for example, from Belgian Pat. No. 558,078 and German Pat. No. 2,526,720, corresponding to U.S. Pat. No. 4,063,948. Suitable pigments, such as phthalocyanines, azo pigments, disazo pigments, perylene pigments, quinacridone pigments and benzimidazole pigments are disclosed, for example, by German Pat. No. 2,904,183, corresponding to British Pat. No. 2,014,748. The sensitizing dyes of the present invention are usually present in small amounts of about 0.001 to 1%, and the pigments are present, depending on the case, in quantities of up to 50%, relative to the photoconductor fraction.

The layer thickness of the photoconductive layer can be up to about 50 $\mu$m. Preferably, it is within the range from about 2 to 10 $\mu$m.

The photoconductive layer can contain conventional additives, such as flow leveling agents and plasticizers and/or adhesion promoters between the support and the photoconductive layer, in order to improve the surface structure, the flexibility and the adhesion.

The light-sensitive covering layer which contains at least one photochemically reactive compound is described as follows.

In the case where a compound, or a combination of compounds, is used having a solubility in alkaline aqueous and/or alcoholic solvent systems which is increased by actinic radiation, i.e., where a positively working covering layer is provided, the light-sensitive compound is applied alone or in combination with a soluble resin to the photoconductive layer. For example, o-quinonediazides, such as are described in German Pat. No. 1,447,008, corresponding to British Pat. No. 996,315, can be used as the light-sensitive compounds. It is possible, moreover, to use radiation-depolymerizable compounds or resins.

Compositions can also be used that contain a polymer with at least one C—O—C bond, which can be cleaved by acid, a compound that forms a strong acid on irradiation, and a suitable binder, if appropriate, as described in European Patent Application No. 0,082,463. Examples of suitable acid-cleavable compounds are monomeric or polymeric orthocarboxylic acid derivatives, specifically an ester thereof, monomeric or polymeric acetals, enol ethers and N-acyliminocarbonates, and mixtures thereof. As the radiation-sensitive components which form or liberate strong acids, a large number of known compounds are suitable, for example, diazonium, phosphonium, sulfonium and iodonium salts, o-quinonediazide sulfochlorides, halogen compounds and metal-organic halogen compounds.

Another composition which can be used in positive-working recording material contains, as the light-sensitive compound, a copolymer of styrene and maleic acid or anhydride, which is wholly or partially esterified with o-nitrobenzyl alcohol. An additional binder is not absolutely necessary.

Suitable alkali-soluble binders are the binders described above for the photoconductive layer, in a quantity of about 50% to 85% by weight of the light-sensitive covering layer.

The positive-working light-sensitive covering layer is applied in a quantity of about 0.1 to 50 g/m$^2$, corresponding to a layer thickness of about 0.1 to 50 $\mu$m, preferably from about 1 to about 25 $\mu$m.

A negative-working covering layer, when used, contains a compound, or a combination of compounds, having a solubility in alkaline aqueous and/or alcoholic solvent systems which is reduced on actinic irradiation. This light-sensitive layer can additionally contain alkali-soluble binders. Examples of suitable light-sensitive compounds are diazonium salt polycondensation products, such as are obtained, for example, by reacting diphenylamine-4-diazonium salts with aldehydes, preferably with formaldehyde.

Preferably, cocondensates are used which, in addition to diazonium salt units, also contain other units which are not light-sensitive and which are derived from compounds capable of condensation, in particular aromatic amines, phenols, phenol ethers, aromatic thioethers, aromatic hydrocarbons, aromatic heterocyclic compounds and organic acid amides. Such condensation products are described in German Offenlegungsschrift No. 2,024,244, corresponding to British Pat. No. 1,312,925. Those diazonium salt polycondensation products described in German Offenlegungsschrift No. 2,739,774, corresponding to U.S. Pat. No. 4,185,017, are also suitable. Other light-sensitive compounds which can be used in the present invention are low-molecular or high-molecular organic azides, in particular low-molecular aromatic azido compounds which contain at least two azido groups. Examples of suitable compounds are 4,4'-diazido-stilbene, 4,4'-diazido-stilbene-2,2'-disulfonic acid, 4,4'-diazido-benzophenone and 4,4'-diazido-diphenylmethane. Further examples are the azidostyryl compounds mentioned in British Pat. No. 790,131, the azidoimidazolyl compounds mentioned in German Pat. No. 950,618 (corresponding to British Pat. No. 765,909), and the diazido stilbene compounds mentioned in U.S. Pat. No. 2,848,328.

The negative-working covering layers according to the present invention contain in general 5% to 90% by weight, and preferably 20% to 70% by weight, of diazonium or azido compounds and 95% to 10%, preferably 80% to 30%, of an alkali-soluble or swellable binder. Examples of suitable binders are the polymers described above for the photoconductor layer.

To stabilize the light-sensitive diazonium salt or azido compounds, it is advantageous to add a compound having an acidic character. Particularly suitable acids are phosphoric and phosphonic acids.

Furthermore, additives, like plasticizers, adhesion promoters, surface-active substances, dyes, pigments, color formers and small quantities of other resins can be added to the light-sensitive mixtures, as described above, for the light-sensitive covering layer. Suitable additives also include, for example, condensed melamine/formaldehyde resins which facilitate final thermal hardening. The nature and quantity of these additives depend on the intended field of use. Care must be taken, however, to ensure that the added substances neither affect the photoconductive properties of the recording material nor impede the light reaction during actinic irradiation.

In addition, the covering layer can contain dyes or pigments which increase the layer strength and enhance the contrast after irradiation. Dyes, such as those listed in U.S. Pat. No. 3,218,167 and No. 3,884,693, are suitable. Viktoriareinblau FGA (C.I. Basic Blue 81), Viktoriareinblau B (C.I. 44,045), rhodamines and Orasol blue GN are particularly suitable. Image contrast after irradiation can be enhanced by the addition of metanil yellow (C.I. 13,065) or phenylazodiphenylamine.

Photopolymerizable compositions can also be used for the light-sensitive, negative-working layer. Such compositioins as a rule contain binders, one or more addition-polymerizable compounds and a photopolymerization initiator.

Examples of suitable binders are methyl acrylate or methyl methacrylate/acrylic or methacrylic acid copolymers; benzyl acrylate or methyl methacrylate/acrylic or methacrylic acid copolymers; benzyl acrylate or benzyl methacrylate/itaconic acid copolymers; styrene/itaconic acid copolymers; half-esters and half-amides of styrene/maleic anhydride copolymers; terpolymers of acrylic or methacrylic acid/styrene/alkyl acrylate or alkyl methacrylate; and vinyl acetate / crotonic acid copolymers.

Compounds with one, and preferably with several, unsaturated groups are suitable as additionpolymerizable monomers. Preferred examples are ethylene glycol diacrylate and dimethacrylate, polyethylene glycol diacrylate and dimethacrylate, trimethylolethane triacrylate and trimethacrylate, trimethylolpropane triacrylate and trimethacrylate, neopentyl glycol diacrylate and dimethacrylate, pentaerythritol and dipentaerythritol tri-, tetra- and hexa-acrylate and -methacrylate, epoxydiacrylate and epoxydimethacrylate, oligo-acrylates (Japanese Published Application No. 7,361/77), and acrylic urethane resins and acrylic urethane oligomers (Japanese Published Application No. 41,708/73).

Examples of suitable photopolymerization initiators are vicinal polyketaldonyl compounds (U.S. Pat. No. 2,367,660), α-carbonyl compounds (U.S. Pat. No. 2,367,661 and No. 2,367,670), acyloin ethers (U.S. Pat. No. 2,448,828), aromatic acyloin compounds which are substituted with an α-hydrocarbon (U.S. Pat. No. 2,722,512), polynuclear quinone compounds (U.S. Pat. No. 3,046,127 and No. 2,951,758), combinations of triallylimidazole dimer and p-aminophenyl ketone (U.S. Pat. No. 3,549,367), benzothiazole compounds (Japanese Published Application No. 48,516/76), benzothiazole compounds /trihalogenomethyl-s-triazine compounds (Japanese Laid-Open Application No. 74,887/79 and German Offenlegungsschrift No. 3,038,605 corresponding to U.S. Pat. No. 4,421,844), and acridine and phenazine compounds (U.S. Pat. No. 3,751,259).

Thermal polymerization inhibitors, such as are known from German Offenlegungsschrift No. 3,310,804 corresponding to British Pat. No. 2,121,201, including hydroquinone, benzoquinone and pmethoxyphenol, are preferably used in addition to the materials mentioned above. In some cases, dyes, pigments and pH indicators can also be added in order to increase the image contrast.

The thickness of the negative-working covering layer can vary within wide limits and can assume values within the range from about 0.1 to 50 μm. If diazonium salt polycondensates are used, thicknesses of about 0.2 to 3 μm are appropriate and, if photopolymerizable compositions are used, thicknesses in the range from about 5 to 50 μm are employed.

The light-sensitive covering layer used can also be a material which, depending on the processing method, is positive- or negative-working. Such a process and a corresponding material are described, for example, in European Patent Application No. 0,082,463.

The photoconductive coating can be applied to the support, in accordance with known methods, by coating, dipping or spraying. The light-sensitive covering layer is preferably applied by lamination or spraying, in order to avoid damage to the photoconductive layer.

Lamination can be carried out by means of a commercially available laminator. In this case, the light-sensitive layer is first applied to a temporary support, for example a polyester film of 20 to 50 μm thickness, by coating, dipping or spraying, and is then transferred frm this temporary support to the photoconductive layer by applying pressure and heat. The temporary support can be readily removed after cooling, or even only before processing.

If the light-sensitive covering layer is applied by spraying, the solvent composition and the coating conditions must be selected such that the photoconductor layer is not incipiently dissolved and a uniform closed film thereby formed.

If the covering layer is applied by coating, this is done by curtain-coating, since mixing of the two layers cannot be excluded if whirler-coating or related methods are used.

The supports used in the present invention can be selected from materials conventionally employed for this purpose, such as aluminum, zinc, magnesium, chromium and copper plates, the surfaces of which have optionally been pretreated, and also metallized cellulose products, e.g., films of cellulose hydrate, cellulose acetate and cellulose butyrate. Paper which has been rendered superficially hydrophilic and electrically conductive, and plastic films, as well as composite materials of paper or film and metal, can also be used. Multi-metal support material is also suitable.

The preferred support material used for printing forms is mechanically or electrochemically roughened aluminum which may have been provided with a superficial oxide layer and aftertreated with substances which render it hydrophilic, such as polyvinylphosphonic acid.

For the production of printed circuits, metallized plastic supports in the form of films or boards are used, in which case the metal layer can be applied by vapor deposition, lamination, chemical deposition or electrodeposition. In this case, the support surface exposed after decoating is etched or strengthened by electroplating in these areas.

The present invention also relates to a process for the production of a printing form or printed circuit by electrophotographic means, in which a recording material composed of an electrically conductive support and a photoconductive layer system located thereon is electrostatically charged and imagewise exposed, and the resulting charge image is rendered visible by means of a finely particulate toner. The whole area is then subjected to actinic radiation and then to decoating. The process comprises using, as the photoconductive layer system, a double layer which, relative to the support, is composed of a photoconductive coating and a light-sensitive covering layer which is differentiated by actinic radiation with respect to its solubility. As desired, those areas of the light-sensitive covering layer which are not covered by toner are dissolved away (decoated), together with the photoconductive layer constituents located therebeneath or those areas of the light-sensitive covering layer which are covered by toner are dissolved away (decoated) with the underlying photoconductive layer constituents, depending on whether positive or negative reproduction, respectively is intended.

The process according to the present invention is illustrated schematically in the attached figures.

Figure 11:
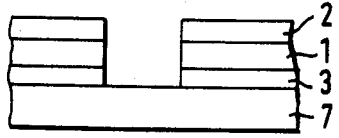

In FIG. 1, the recording material according to the present invention is shown, where 1 is the photoconductive layer, 2 is the light-sensitive covering layer and 3 is the support, here shown only as a metal plate. But as indicated in FIG. 11, the support can also comprise, for example, a film or plastic sheet 7 which is provided with an electrically conductive layer 3. An organic photoconductor is preferably used in the photoconductive layer 1. The light-sensitive covering layer 2 contains at least one compound which confers post-irradiation solubility in a particular decoating solution, or at least one compound which confers insolubility in the particular decoating solution after irradiation.

Figure 2:
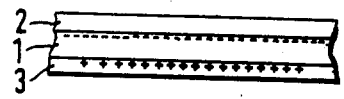
Figure 3:
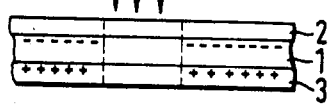
FIGS. 3-9, 9A, 9B, 10-11, and 11A present schematic representations of various manipulations of the recording material of the present invention, for example, in the manufacture of a printing form or printed circuit.
Figure 4:
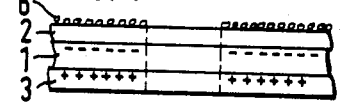

FIG. 2 illustrates the electrostatic charge, generated, for example, by corona-charging, of the recording material according to the present invention, which charge, as shown, can be negative or positive. FIG. 3 diagrammatically shows the imagewise exposure (h·$\gamma_1$) of the charged material, which exposure can be effected by a lens system by projection or directly by means of laser beams. FIG. 4 illustrates how the resulting charge image is rendered visible by means if an electrostatic developer. This can be carried out either with a liquid developer or with a dry developer. A toner of opposite charge can be used, as shown here, but the image can also be rendered visible by reversal development with a toner charged in the same sense as the electrostatic charge. The formed toner image 6 can be fixed by the process according to the present invention, i.e., the toner image can be baked or consolidated by solvent vapors. Preferably, however, because of the subsequent removal of the toner image, it is advantageous not to fix the toner image and merely to leave it in the developed state, corresponding to the existing electrostatic and adhesive forces.

Figure 5:
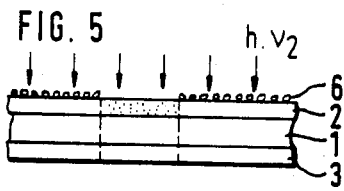
Figure 6:
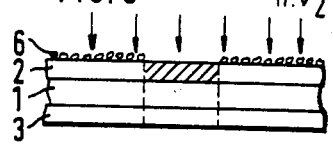

FIGS. 5 and 6 illustrate the irradiation with actinic light (h·$\gamma_2$). For example, metal halide/mercury vapor lamps, which emit a high spectral fraction in the near ultraviolet region, are suitable for this purpose. The irradiation can serve to convert the areas (4) not covered by toner into a soluble state, or for rendering insoluble the areas (5) which are not covered by toner; a positive process is shown in FIG. 7, and a negative process in FIG. 8.

Figure 7:
Figure 8:
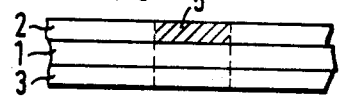

FIG. 7 illustrates the printing plate freed from toner in accordance with the process shown in FIG. 5, while FIG. 8 illustrates the printing plate freed from toner as shown in FIG. 6. In both instances, these plates are then subjected to the decoating process. The composition of suitable decoating solutions is known from German Pat. No. 1,117,391, corresponding to British Pat. No. 944,126. As decoating solutions suitable for the process of the present invention, alcohol mixtures are used to which alkali is added in the form of sodium metasilicate or ethanol-amine. Preferably, an alkaline-aqueous solution, which may contain a wetting agent, is used as a decoating solution. If possible, the toner removed can be reused. The removal of toner and the decoating can also take place in one step, and this is preferred. The layer constituents remaining after the decoating process, i.e., after the dissolving-away step, can be subjected to final thermal hardening. This results in the finished printing forms according to FIGS. 9 or 10, respectively, as positive or negative printing plates.

Figure 9:
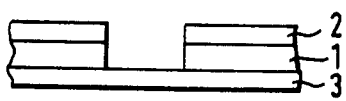
Figure 9A:
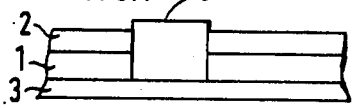
Figure 11A:
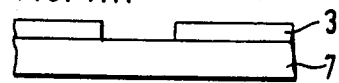
Figure 9B:
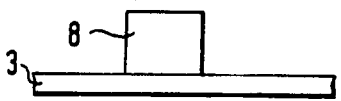

In the case where the support, as mentioned above, is composed of a metallized plastic plate (3, 7), the material according to FIG. 9 can be subjected to etching, whereby the metal image bared by the decoating is removed (FIG. 11). After stripping of the remaining layer constituents, a printed circuit according to FIG. 11A results. However, the material according to FIG. 9 can also be subjected to an electroplating bath, thereby reinforcing the bared metal areas with application of a further metal layer 8 by electroplating, as shown in FIG. 9A. After stripping, a finished circuit board 9B is obtained.

Figure 10:

Process steps corresponding to those shown, starting from a material according to FIG. 9, can also be carried out with a material as shown in FIG. 10.

According to the present invention, it is also possible, when using an appropriate material for the light-sensitive covering layer, to convert a positive-working material to negative-working, if required, by incorporating further process steps, such as heating and repeated irradiation.

The process of the present invention has numerous advantages. Due to the high light sensitivity of the electrophotographic double-layer system, the imagewise exposure can be effected by projection of the image original or directly by a laser, which can be of low power. In the case of projection exposure, any desired number of printing plates or circuit images can be produced from one original, without the latter coming into contact with the light-sensitive material. The original is therefore subjected to little if any wear.

It is not even necessary to fix the toner image produced by electrophotographic means. Therefore, the toner mask can, in a simple manner, be corrected or completely removed, before or during decoating. As a consequence, there is no interference, due to the presence of toner, with processing steps carried out later and, in particular, the problem of "toner runoff" at the start of printing, as occurs with conventional electrophotographic printing plates using a fixed toner image, does not arise.

A further advantage is that the toner image is produced directly on the light-sensitive covering layer. Since the whole area is irradiated, there are no uncontrolled halations, such as are frequently the case when film originals are used, due to air occlusions between the film and the light-sensitive layer. The irradiation can therefore be carried out without the use of a vacuum printing frame, i.e., even during the transport of the plate, thereby saving time.

A coloring of the light-sensitive covering layer produces a color change directly during irradiation, so that irradiated plates and not-yet irradiated plates can be distinguished, even if the toner image has already been removed. In addition, the image areas can be distinguished fron the non-image areas.

The reproduction of tonal values in halftone originals can be influenced by the selection of the irradiation conditions, as is known for conventional positive- or negative-working printing plates. The increase in tonal value, which occurs in the press in offset printing, can at least partially be compensated in this way.

In decoating by dissolving away, only the more readily soluble non-image areas are removed, and the double-layer arrangement is fully preserved in the image areas.

It is possible, finally, to harden the layer areas which remain after decoating by applying heat, whereby the resistance of the surface to chemicals or to mechanical stress can be further improved.

A further special advantage of the process is its versatile applicability, depending on the starting material and the process steps. A positive-negative reversal can be achieved, for example, by appropriate charging of the electrophotographic double layer and toner, by the selection of a positive- or negative-working covering layer, or even by the selection of a covering layer which, depending on the processing, works positively or negatively.

Since fixing of the toner image is not necessary, the charging and the application of toner can be repeated as required, or the entire process sequence can be carried out in several cycles with different image originals.

The examples which follow are intended to describe, without restricting, the present invention in more detail.

EXAMPLE 1

The following coating solution:
50 p.b.w. (parts by weight) of a copolymer of styrene and maleic anhydride (Scripset ® 540, Monsanto),
42 p.b.w. of 2-vinyl-4-(4'-diethylaminophenyl)-5-(2'-chlorophenyl)-oxazole,
0.2 p.b.w. of rhodamine FB (C.I. 45,170)
360 p.b.w. of ethylene glycol monomethyl ether and
550 p.b.w. of tetrahydrofuran was applied to an electrochemically roughened and anodized, 0.3 mm-thick aluminum plate which had been after-treated with polyvinylphosphonic acid according to German Offenlegungsschrift No. 1,621,478, corresponding to British Pat. No. 1,230,447.

After drying, the layer weight was 3.0 g/m².

To this photoconductive layer, a light-sensitive covering layer of 2.0 g/m² was applied by spraycoating with the following solution:
0.8 p.b.w. of the esterification product obtained from 1 mol of 2,3,4-trihydroxybenzophenone and 3 mol of 1,2-naphthoquinone-2-diazide-5-sulfonic acid chloride,
0.40 p.b.w. of the esterification product obtained from 1 mol of 2,2'-dihydroxy-1,1'-dinaphthylmethane and 2 mol of 1,2-naphthoquinone-2-diazide-5-sulfonic acid chloride,
6.00 p.b.w. of a cresol-formaldehyde novolak having a softening point of 120° to 135° C. and a mean molecular weight of 1,500,
0.60 p.b.w. of 1,2-naphthoquinone-2-diazide-4-sulfonic acid chloride and
0.30 p.b.w. of crystal violet (C.I. 42,555) in
40.00 p.b.w. of ethylene glycol monomethyl ether and
50.00 p.b.w. of tetrahydrofuran.

The two-layer combination thus obtained was provided with a negative charge by means of a corona discharge in a commercially available machine for the production of electrophotographic printing forms, and was imagewise exposed for 20 seconds by projection. The latent charge image was then developed with a commercially available electrophotographic dry developer.

The aluminum plate with applied toner was then irradiated for 1.0 minute with a 5 kW metal halide lamp.

Finally, a decoating solution of sodium silicate, glycerol, water, ethylene glycol and ethanol, as disclosed by European Pat. No. 0,034,317, corresponding to U.S. Pat. No. 4,388,391, was applied to the plate with a cotton pad. This solution completely dissolved the toner-free layer constituents of the covering layer, together with the photoconductor layer located below. The non-fixed toner was at the same time washed off the image areas of the aluminum plate. The layer constituents located below were unaffected.

By selecting a correspondingly longer irradiation time, it was possible to sharpen the plate, like a conventional positive plate, and this led to a more open reproduction of tonal values. A run of 150,000 copies was obtained from the plate, and this could be increased to 180,000 by final thermal hardening of the remaining layer before printing (5 minutes, 220° C.).

EXAMPLE 2

A photoconductor layer having a layer weight of about 4.5 g/m² was applied to a printing plate support, as described in Example 1.

To this layer, a light-sensitive coating of the following composition was applied in such a way that the layer weight after drying was about 1.5 g/m²:

97.0 p.b.w. of a binder obtained by reacting 11.3 p.b.w. of a polyvinyl butyral having a moclar weight of 70,000 to 80,000 with 5.11 p.b.w. of propenylsulfonyl isocyanate (corresponding to German Auslegeschrift No. 2,053,363 or U.S. Pat. No. 3,732,106), 48.3 p.b.w. of a diazonium salt polycondensation product prepared from 1 mol of 3-methoxydiphenylamine-4-diazonium sulfate and 1 mol of 4,4'-bismethoxydiphenyl ether in 85% phosphoric acid and isolated as the mesitylenesulfonate, 4.5 p.b.w. of phosphoric acid and 3.5 p.b.w. of Viktoriareinblau FGA (C.I. Basic Blue 81) in 3,500 p.b.w. of ethylene glycol monomethyl ether and 1,035 p.b.w. of tetrahydrofuran.

As described in Example 1, the double layer thus obtained was electrostatically charged and exposed. The resulting charge image was developed with a liquid developer adjusted for positive development and then irradiated for 2 minutes under a metal halide lamp of 5 kW power.

To remove the layer constituents with applied toner, an aqueous decoating solution of:

5 p.b.w. of sodium octyl-sulfate,
2 p.b.w. of sodium metasilicate pentahydrate,
1 p.b.w. of trisodium phosphate and
1 p.b.w. of phenoxyethanol was used.

The treatment time was 90 seconds. Within this time, both the toner constituents and the layer constituents located below were completely detached.

The toner-free layer constituents of the double layer were completely preserved and, on printing, gave a negative image of the exposure original.

Since the toner image showed an increase in tonal value as compared with the original, the increase in tonal value to be observed in negative layers was at least partially compensated.

EXAMPLE 3

As described in Example 2, a double layer comprising a photoconductor layer, which contained 2,5-bis-(4'-diethylaminophenyl)-1,3,4-oxadiazole as the photoconductor, and a negative-working covering layer was produced on a 100 μm-thick aluminum printing plate support having a mechanically roughened surface. Instead of the reaction product of polyvinyl butyral and propenylsulfonyl isocyanate, a copolymer of styrene and maleic anhydride (Scripset® 540, Monsanto) was used as the binder in the covering layer. The decoating solution mentioned in Example 2 was used for decoating this plate.

A printing plate was obtained from which perfect prints could be prepared right from the start of printing, and a longer run was achieved than with a conventional electrophotographic printing plate.

EXAMPLE 4

The photoconductor layer described in Example 1 was applied in a layer weight of 6 g/m² to a 35 μm-thick copper foil which was free from oxide layers and which was laminated to a 1.5 mm-thick laminated phenoplast sheet.

A coating solution as disclosed by European Patent Application No. 0,082,463, having the following composition:

40 p.b.w. of methyl ethyl ketone,
15 p.b.w. of ethylene glycol ethyl ether acetate,
5 p.b.w. of diethylene glycol monoethyl ether,
28 p.b.w. of a cresol/formaldehyde novolak having a softening range from 105° to 120° C. by the DIN 53,181 capillary method,
3.5 p.b.w of polyvinyl ethyl ether (Lutanol A 25),
8.3 p.b.w. of the polyacetal of 2-ethylbutyraldehyde and triethylene glycol,
0.2 p.b.w. of 2-(6-methoxy-naphth-2-yl)-4,6-bistrichloromethyl-s-triazine and
0.01 p.b.w. of crystal violet base was whirler-coated onto a 50 μm-thick polyester film as a temporary support, and the supported coating was then used as a dry resist material.

The layer thickness after drying was 25 μm.

In a laminator used for processing dry resist material, the resist material was transferred as the light-sensitive covering layer to the surface of the photoconductor layer, with application of pressure and at a temperature of 130° C. The polyester film used as the temporary support was then peeled off at room temperature.

The copper base was connected to ground, and the double layer was negatively charged by means of a corona, imagewise exposed, and thereafter developed with a commercially available dry developer. The plate was then aftertreated for 10 minutes at 80° C. The whole area was subsequently irradiated for 0.5 minute with a 5 kW metal halide lamp through the toner mask. (If a correction was necessary, the toner could be removed by wiping and the irradiation step repeated.)

Decoating was carried out in two steps, with quick working, using an aqueous solution of 5 p.b.w. of sodium metasilicate ×9 H₂O, 3 p.b.w. of trisodium phosphate ×12 H₂O and then with the solution described in Example 2, or, alternatively, in one step with a solution which contained 6 p.b.w. of diethylene glycol monoethyl ether, 5 p.b.w. of propanol, 0.7 p.b.w. of sodium metasilicate, 2.5 p.b.w. of trisodium phosphate and 85 p.b.w. of water.

In both cases, the toner-free layer constituents of the double layer were completely detached, whereas the image areas were preserved and, on these, only the toner was washed off.

The bared copper layer was then etched away and the etch resist, i.e., the remaining layer constituents, were stripped with solvents, such as acetone or methylglycol.

A printed circuit with exact track boundaries was obtained in this way.

EXAMPLE 5

The procedure followed was as in Example 4, with the difference that, after the irradiation step, the toner image was removed by wiping, the plate was heated for 30 minutes to 120° C. and the plate, cooled to room temperature, was then irradiated once more under a metal halide/mercury vapor lamp. Subsequently, decoating was carried out and, as distinct from Example 4, a negative image of the image original was obtained. The production of a printed circuit was continued as described in Example 4.

EXAMPLE 6

The procedure followed was as in Example 4, with the difference that a negative-working material was laminated as the light-sensitive covering layer to the photoconductor layer.

For this purpose, the following formulation was applied to polyester film as a temporary support, as described in Example 4:

- 6.5 p.b.w. of a terpolymer of n-hexyl methacrylate, methacrylic acid and styrene (60:30:10 parts by weight) having a mean molecular weight of 35,000 (according to German Auslegeschrift No. 2,363,806, corresponding to U.S. Pat. No. 3,930,865),
- 5.0 p.b.w. of an unsaturated polyurethane synthesized from 3 mol of 2,2,4-trimethylhexamethylene diisocyanate and 2 mol of tri-ethylene glycol (1st reaction stage) and then 2 mol of hydroxyethyl methacrylate (2nd reaction stage),
- 2.8 p.b.w. of 2-ethylhexyl 4-hydroxybenzoate,
- 0.2 p.b.w. of 9-phenylacridine,
- 0.1 p.b.w. of 3-mercaptopropionic acid 2,4-dichloroanilide and
- 0.025 p.b.w. of the dye "Disperse Red" (C.I. 179) in
- 25 p.b.w. of methyl ethyl ketone and
- 2 p.b.w. of ethanol.

As described in Example 4, the double layer obtained was electrophotographically treated and developed, and irradiated for 1 minute with a 5 kW metal halide lamp.

Decoating was carried out with the following solution:

- 4 p.b.w. of sodium lauryl-sulfate,
- 1 p.b.w. of sodium carbonate,
- 2 p.b.w. of trisodium phosphate ×12 $H_2O$,
- 2 p.b.w. of sodium metasilicate ×5 $H_2O$,
- 1 p.b.w. of phenoxyethanol and
- 90 p.b.w. of water.

The above-described procedure yielded a negative image of the original, which could be used as a printed circuit board.

What is claimed is:

1. A light-sensitive recording material comprised of
   (A) an electrically conductive support which is suitable for the production of printing forms or printed circuits,
   (B) at least one photoconductive layer having a first and a second surface, said photoconductive layer
     (i) containing a resin binder which is soluble in an aqueous alkaline or alcoholic alkaline solvent and
     (ii) being applied along said first surface to said support, and
   (C) a light-sensitive covering layer applied to said second surface of said photoconductive layer, said covering layer comprising a photochemically reactive composition which contains at least one compound having a solubility in an aqueous alkaline or alcoholic alkaline solvent which is increased by actinic radiation, whereby said solvent is capable of decoating actinic radiationexposed portions of said covering layer and portions of said photoconductive layer located beneath the portions of said covering layer.

2. A recording material as claimed in claim 1, wherein said photochemically reactive composition comprises at least one o-quinonediazide compound.

3. A recording material as claimed in claim 1, wherein said solvent system comprises a wetting agent.

4. A recording material as claimed in claim 1, wherein said covering layer has a thickness within the range from about 0.1 to about 50 μm.

5. A recording material as claimed in claim 4, wherein said covering layer has a thickness within the range from about 1 to about 25 μm.

6. A recording material as claimed in claim 1, wherein said photoconductive layer has a thickness within the range from about 2 to about 10 μm.

7. A recording material as claimed in claim 1, wherein said covering layer further comprises a coloring agent.

8. A recording material as claimed in claim 1, wherein said electrically conductive support is comprised of material selected from the group consisting of aluminum, zinc, magnesium, chromium, copper, metallized cellulose compound, and paper rendered superficially hydrophilic and electrically conductive.

* * * * *